United States Patent [19]

Enomoto et al.

[11] Patent Number: 4,888,623
[45] Date of Patent: Dec. 19, 1989

[54] SEMICONDUCTOR DEVICE WITH PN JUNCTION ISOLATION FOR TTL OR ECL CIRCUITS

[75] Inventors: Hiromu Enomoto, Kawasaki; Yasushi Yasuda, Inagi; Yoshiki Shimauchi, Kawasaki; Akinori Tahara, Zushi, all of Japan

[73] Assignee: Fujitsu Limited, Kawasaki, Japan

[21] Appl. No.: 256,259

[22] Filed: Oct. 12, 1988

Related U.S. Application Data

[63] Continuation of Ser. No. 876,301, Jun. 18, 1986, abandoned, which is a continuation of Ser. No. 480,586, Mar. 30, 1983, abandoned.

[30] Foreign Application Priority Data

Mar. 30, 1982 [JP] Japan .................................. 57-50079

[51] Int. Cl.$^4$ ............................................. H01L 29/48
[52] U.S. Cl. ......................................... 357/15; 357/48; 357/92; 357/43
[58] Field of Search .................... 357/43, 15 M, 23.13, 357/47, 92, 40, 48, 15, 86, 52, 52 D, 20, 13

[56] References Cited

U.S. PATENT DOCUMENTS

| | | | |
|---|---|---|---|
| 3,878,551 | 4/1975 | Callahan, Jr. .......................... | 357/48 |
| 4,079,408 | 3/1978 | Kwap .................................. | 357/15 X |
| 4,110,775 | 8/1978 | Festa .................................. | 357/15 |
| 4,125,855 | 11/1978 | Davis et al. ......................... | 357/48 X |
| 4,214,315 | 7/1980 | Anantha et al. ..................... | 357/15 |
| 4,233,618 | 11/1980 | Genesi ............................... | 357/48 X |
| 4,260,906 | 4/1981 | Tokumaru et al. ................ | 357/15 X |
| 4,301,382 | 11/1981 | Kameyama .......................... | 357/48 |
| 4,402,003 | 8/1983 | Blanchard .......................... | 357/86 X |
| 4,405,933 | 9/1983 | Avery ................................ | 357/48 X |
| 4,426,655 | 1/1984 | Bhatia ............................... | 357/15 |

FOREIGN PATENT DOCUMENTS

| 0029717 | 6/1981 | European Pat. Off. . |
|---|---|---|
| 58-121663 | 7/1983 | Japan . |
| 2092379 | 8/1982 | United Kingdom . |

OTHER PUBLICATIONS

Hubacher et al., "Overvoltage Protection in Integrated Circuits," *IBM Technical Disclosure Bulletin*, vol. 14, No. 8, Jan. 1972, p. 2306.

IBM Technical Disclosure Bulletin, vol. 21, No. 2, Jul. 1978, "Integrated Delay Circuit", by Heimeier et al., pp. 656–657.

IBM Technical Disclosure Bulletin, vol. 20, No. 10, Mar. 1978, "Protective Circuit for Integrated Semiconductor Devices", by Alameddine, pp. 3962–3963.

Patent Abstracts of Japan, vol. 7, No. 233, Oct. 1983.
Patent Abstracts of Japan, vol. 7, No. 170, Jul. 1983.

*Primary Examiner*—William Mintel
*Attorney, Agent, or Firm*—Staas & Halsey

[57] ABSTRACT

Electrostatical breakage of a semiconductor device, including an epitaxial layer and a buried layer thereunder, connected to an outer signal terminal, can be prevented by forming an impurity region in the epitaxial layer so as to form a PN junction between the buried layer and the impurity region. The impurity region is connected to a power source or ground.

8 Claims, 4 Drawing Sheets

Fig. 3
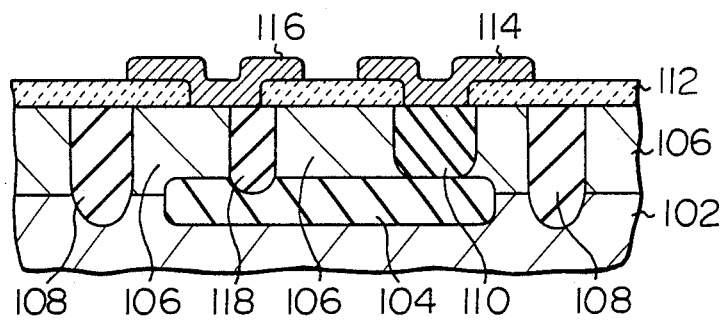
Fig. 4
Fig. 6
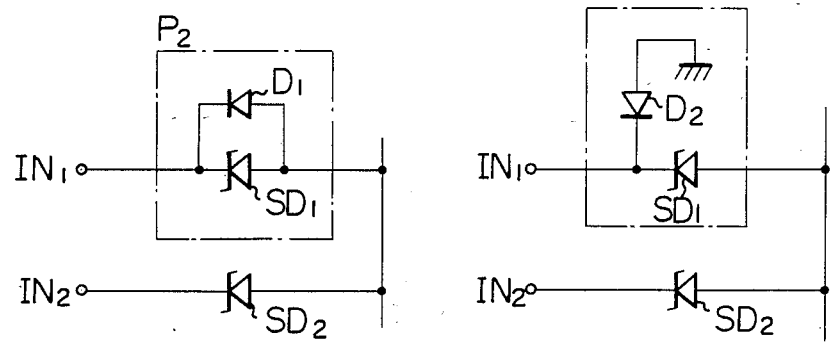
Fig. 5
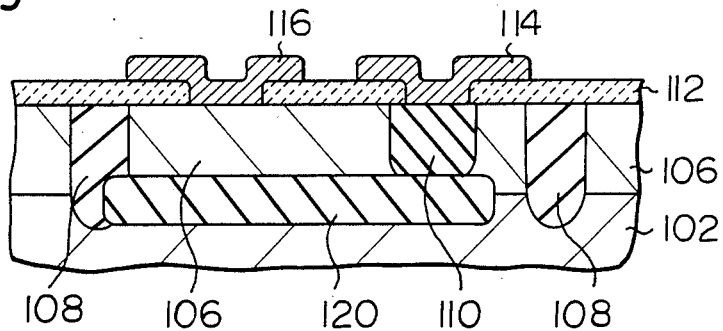

SEMICONDUCTOR DEVICE WITH PN JUNCTION ISOLATION FOR TTL OR ECL CIRCUITS

This is a continuation of co-pending application Ser. No. 876,301 filed on June 18, 1986, which is a continuation of U.S. application Ser. No. 480,586, filed Mar. 30, 1983, both now abandoned.

BACKGROUND OF THE INVENTION

1. Field of the Invention

The present invention relates to a semiconductor device, in particular, a semiconductor device whose resistance against electrostatic breakage is improved.

2. Description of the Prior Art

It is known that input and/or output circuits are often electrostatically broken. The applicants found that when an input or output element is electrostatically broken, for example, in a Schottky barrier diode formed by bringing an electrode of metal, such as aluminum, into contact with an epitaxial layer, the aluminum of the electrode penetrates into the epitaxial layer and reaches the underlying buried layer resulting in a short-circuit. In the case of a bipolar transistor, an emitter-base or base-collector contact is broken, which also results in a short-circuit.

SUMMARY OF THE INVENTION

An object of the present invention is to provide a semiconductor device whose resistance against electrostatic breakage is improved.

This and other objects, features, and advantages of the invention are accomplished by a semiconductor device comprising a substrate, an epitaxial layer of a first conductivity type formed on the substrate, a buried layer of the first conductivity type formed between the substrate and the epitaxial layer and an impurity region of a second conductivity type opposite to the first conductivity type, formed in the epitaxial layer and in contact with the buried layer. The buried layer and the impurity region are electrically connected to an outer signal terminal and a power source or ground.

In a semiconductor device according to the present invention, a buried layer of a first conductivity type is brought into contact with an impurity region of a second conductivity type opposite to the first conductivity type so as to form a PN junction between them. Therefore, when a high potential is applied to a buried layer, the electrostatic charges stored in the buried layer flow through an impurity region due to breakdown of the PN junction therebetween. Thus, the PN junction prevents discharge between the buried layer and an electrode of, e.g., aluminum, which would otherwise result in a short-circuit between them due to penetration of aluminum.

The impurity region may be preferably made by an element isolation region in a semiconductor device.

BRIEF DESCRIPTION OF THE DRAWINGS

FIG. 3 is sectional view of a part of a semiconductor device according to the present invention;

FIG. 4 is a wiring diagram of device of FIG. 3;

FIG. 5 is a sectional view of another semiconductor device according to the present invention, in which an impurity region is made by an isolation region;

FIG. 6 is a wiring diagram of FIG. 5;

DESCRIPTION OF THE PREFERRED EMBODIMENTS

The present invention will now be described with detail in reference to the prior art and preferred embodiments.

Figure 1:
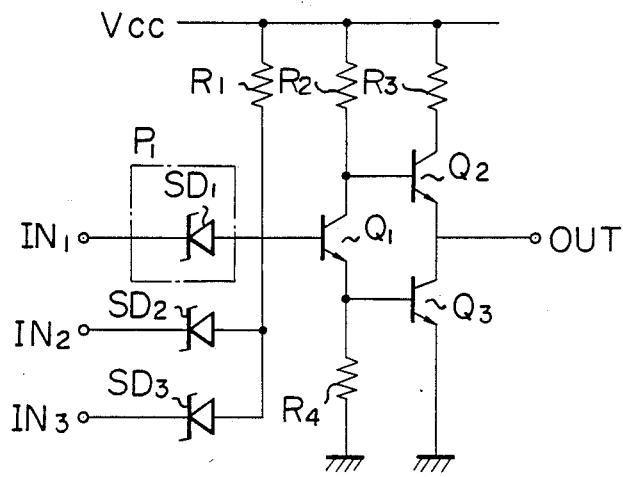
FIG. 1 is a wiring diagram of a prior art transistor-transistor logic (TTL) circuit.

FIG. 1 is a wiring diagram of a prior art TTL circuit. Three Schottky diodes $SD_1$, $SD_2$, and $SD_3$ are connected in parallel so as to form a three-input NAND gate at an input stage. In the circuit, $Q_1$ is a phase dividing transistor, $Q_2$ and $Q_3$ are transistors that form a push-pull output state, $R_1$, $R_2$, $R_3$, and $R_4$ are resistors, and $V_{CC}$ is a power source.

Figure 2:
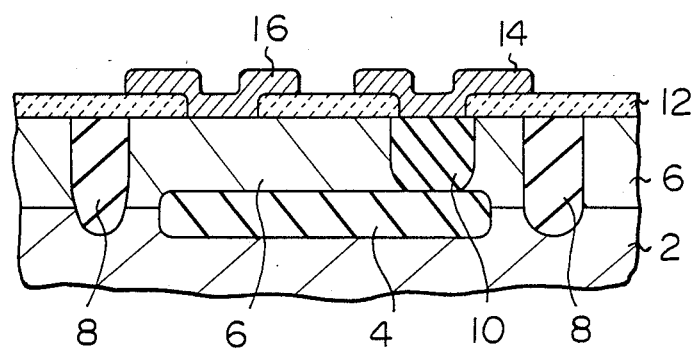
FIG. 2 is sectional view of a part of a semiconductor device including the TTL circuit shown in FIG. 1.

FIG. 2 is a sectional view of a part $P_1$ of a semiconductor device included in the prior art TTL circuit shown in FIG. 1, the part $P_1$ is enclosed by a broken line in FIG. 1. In a P-type silicon substrate 2, a buried layer (N+ layer) 4 is formed by diffusion. An N-type epitaxial layer 6 is grown on the substrate 2, and an isolation region 8 and a contact region 10 for the buried layer 4 are formed in the epitaxial layer 6 by P-type and N-type impurity diffusions, respectively. In many regions in the epitaxial layer 6, elements including input and/or output elements are formed in accordance with a desired circuit. In FIG. 2, a Schottky barrier diode $SD_1$ is formed by bringing an electrode 16 of metal, such as aluminum, into contact with the epitaxial layer 6. Reference numeral 12 denotes an insulating layer, and 14 and 16 electrodes.

FIG. 3 is a sectional view of a part $P_2$ (FIG. 4) of a semiconductor device according to the present invention. The semiconductor device includes a TTL circuit similar to that shown in FIG. 1 except for the part $P_1$. The part $P_2$ replaces the part $P_1$.

Into a P-type silicon substrate 102, arsenic or antimony is selectively heat diffused at about 1200° C. to 1300° C. to form a buried layer (N+ layer) 104. The buried layer 104 is about 3 μm (micrometer) in depth and about 20Ω/□ in sheet resistance. On the substrate 102, an N-type silicon epitaxial layer 106 is grown. The epitaxial layer 106 is about 4 μm in thickness and about 0.6 to 0.9Ω·cm in resistance. The surface of the epitaxial layer 106 is oxidized and patterned to open windows for diffusion. These windows include not only windows for element isolation, but also a window at a part of the area where a Schottky diode is later formed. A boron silicate glass layer is covered entirely over the oxide layer. Then, boron existing in the boron silicate glass is heat diffused at about 1200° C. through the windows to form isolation regions 108 as well as a boron-diffused region 118 reaching the buried layer 104 under the window at a part of the area where the Schottky diode is to be formed. These boron-diffused regions 108 and 118 have about a $10^{20}$ cm$^{-3}$ boron concentration and about 6Ω/□ in resistance. Then, according to a conventional process, an N+ contact region 110 is formed, an oxide layer 112 is formed and patterned, and an aluminum layer is deposited and patterned to form electrodes 114 and 116 and conducting lines (not shown).

The thus fabricated part $P_2$ shown in FIG. 3 corresponds to the enclosed part $P_2$ of the wiring diagram shown in FIG. 4. In FIG. 4, a PN junction formed by the contact of the buried layer 104 and a boron-diffused region 118 is expressed by a diode $D_1$.

In a semiconductor device according to the present invention, if an excessively high electrostatic voltage is applied to an input terminal $IN_1$, the charge flows through the diode $D_1$, which has a breakdown voltage lower than the voltage at which electrostatic breakage occurs between the buried layer 104 and the electrode 116, and through a resistor $R_1$ or other parts to a power source or ground. Therefore, the Schottky barrier diode $SD_1$ is not subject to excessive voltage, and electrostatic breakage is prevented.

To test the resistance against electrostatic breakage of the above fabricated semiconductor device, an electrostatic voltage was applied from a charged 200 pF capacitor with no series connected resistance between the input terminal $IN_1$ which is connected to the electrode 114, and ground, which is connected to the boron-diffused region 118. The resultant breakage voltage of the Schottky diode $SD_1$ was 230 V. For comparison, a semiconductor device of the prior art, similar to the above semiconductor device except that the boron-diffused region 118 was not formed, was also tested. The resultant voltage was 160 V.

FIG. 5 is another semiconductor device according to the present invention, in which an impurity region corresponding to the boron-diffused region 118 in the above example was formed by an element isolation region. In FIG. 5, 102 denotes a silicon substrate, 106 an epitaxial layer, 108 an isolation region, 110 a contact region, 112 an oxide layer, and 114 and 116 electrodes. This semiconductor device was fabricated in the same manner as the above-described semiconductor device, except that an arsenic or antimony-diffused buried layer 120 was extended to contact the boron-diffused isolation region 108 and the boron-diffused region 118, extending from the electrode 112 to the buried layer 120 in the epitaxial layer 106, was not formed. Alternatively, a contact between the arsenic or antimony-diffused buried layer and a boron-diffused isolation region may be formed by extending the isolation region not the buried layer or by extending both. The isolation region 108 contacting the buried layer 120 is connected to ground.

The part shown in FIG. 5 corresponds to the enclosed part $P_3$ of the wiring diagram of FIG. 6. Where the buried layer 120 and the isolation region 108 contact, a diode $D_2$ is formed. The thus fabricated semiconductor device having a TTL circuit including the diode $D_2$ was subjected to the same test as mentioned before. The resultant electrostatic breakage voltage was 240 V.

In the above examples, it is obvious that an input or output element may not only be a Schottky diode but also a bipolar transistor or other element.

Figure 7:
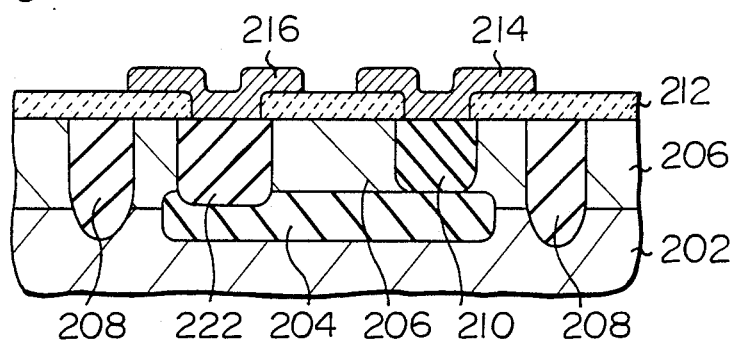
FIG. 7 is a sectional view of a semiconductor device according to the present invention, used as a separate protective element.
Figure 8:
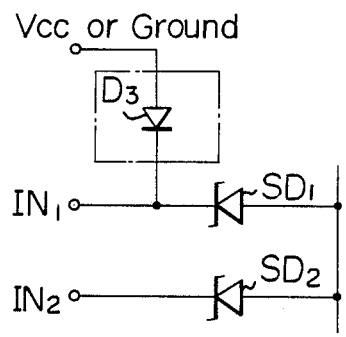
FIG. 8 is a wiring diagram of device of FIG. 7.

While diodes $D_1$ and $D_2$ are in the form of a complex element including the diodes $D_1$ and $D_2$ and a Schottky diode $SD_1$, i.e., an input or output element, a diode comprising a buried layer and an impurity region may be formed separately from an input or output element. FIG. 7 illustrates a diode comprising a buried layer and an impurity region formed separately from an input element. This diode is incorporated in a semiconductor device including a TTL circuit as shown in FIG. 1. In FIG. 7, 202 denotes a silicon substrate, 204 an arsenic or antimony-diffused buried layer, 206 an N-type epitaxial layer, 208 a boron-diffused isolation region, 210 an N+ contact region, 212 an oxide layer, and 214 and 216 electrodes, all of which are formed similarly to the corresponding parts in the first example. In this example, however, a boron-diffused region 222 extending from the electrode 216 to the buried layer 204 is formed in the entire area of the electrode 216, not a part thereof. The contact of the arsenic or antimony-diffused, i.e., N-type, buried layer 206, and the boron-diffused, i.e., P-type region 222 forms a PN junction, i.e., a diode $D_3$. The electrode 216 is connected to a power source or ground and the electrode 214 is connected to an outer signal terminal, an input terminal $IN_1$, and a Schottky diode $SD_1$. The diode $D_3$ is wired as in the diagram of FIG. 8.

Figure 10:
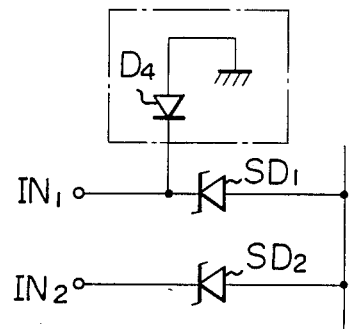
FIG. 10 is a wiring diagram of FIG. 9.
Figure 9:
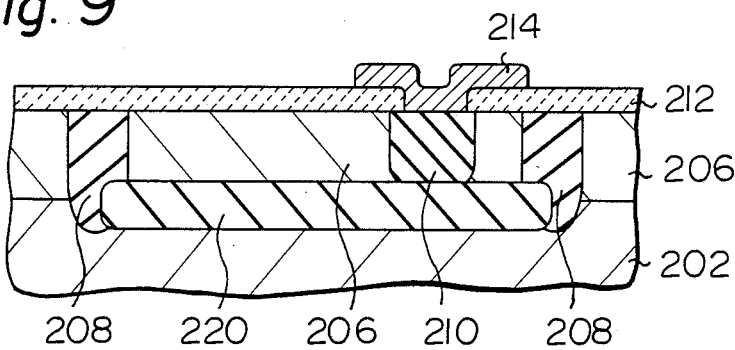
FIG. 9 is a sectional view of another semiconductor device according to the present invention, which is used as a separate protective element.

Alternatively, a separate diode comprising a buried layer and an impurity region may be formed by using an isolation region as the impurity region as in FIGS. 9 and 10. In FIG. 9, 202 denotes a silicon substrate, 206 an epitaxial layer, 208 an isolation region, 210 a contact region, 212 an oxide layer, and 214 an electrode. The diode is formed by extending the buried layer 220 so as to contact the isolation region 208. The electrode 214 is connected with an input terminal $IN_1$ and a Schottky barrier diode $SD_1$. The isolation region 208 connected to the buried layer 220 forms a PN junction therebetween and is connected to ground due to the absence of an electrode therefore and forms a diode $D_4$. The wiring of the diode $D_4$ is shown in the diagram of FIG. 10.

Figure 11:
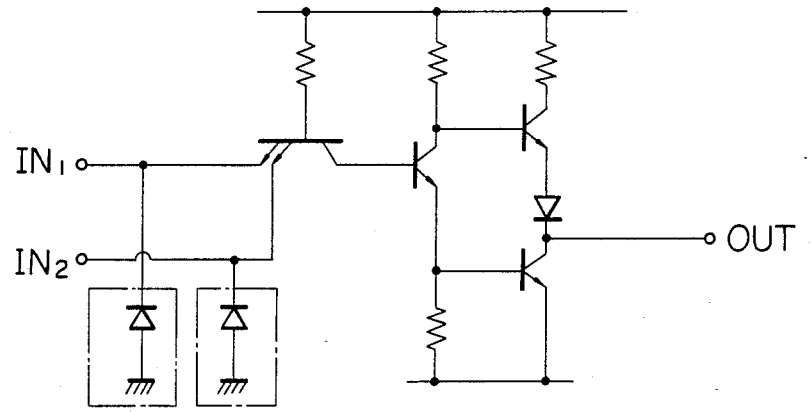
FIG. 11 is a wiring diagram of a TTL circuit in which the transistor is used as an input element.
Figure 12:
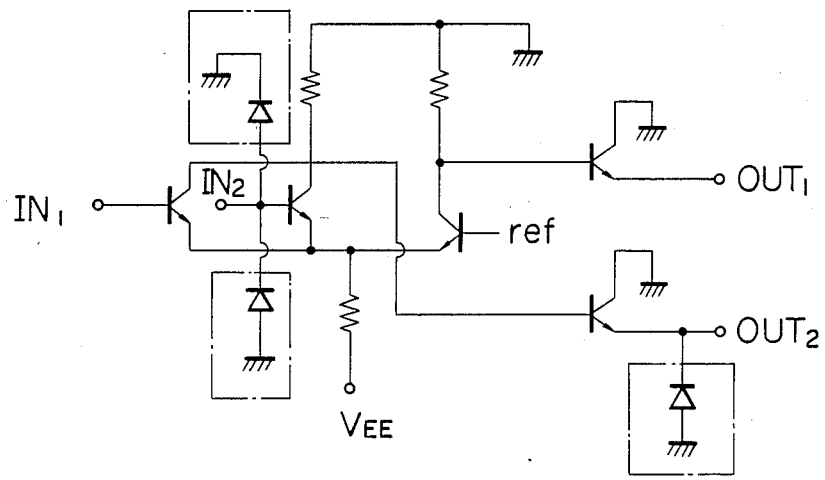
FIG. 12 is wiring diagram of a emitter coupled logic (ECL) circuit.

FIGS. 11 and 12 show examples of a semiconductor device in which a transistor, not a diode, is used as an input and/or output element. FIGS. 11 and 12 are TTL and ECL circuits, respectively.

The portion where a diode, comprising a buried layer and an impurity region, is connected may be any outer signal terminal or input or output terminal.

We claim:

1. A semiconductor device having an inner circuit element and an outer signal terminal connected thereto, comprising:

a semiconductor substrate;

an epitaxial layer of a first conductivity type formed on said substrate and having a first impurity concentration;

a buried impurity-doped region of the first conductivity type formed between said substrate and said epitaxial layer, said buried impurity-doped region having a second impurity concentration which is higher than the first impurity concentration of said epitaxial layer;

an insulating layer formed on said epitaxial layer and having first and second windows formed therein;

a first electrode formed in said first window and on said epitaxial layer above said buried impurity-doped region and formed of a conductive material, said first electrode formed in said first window forming a Schottky barrier diode with said epitaxial layer and being electrically connected with said inner circuit element;

a first impurity-doped region of a second conductivity type opposite the first conductivity type, said impurity-doped region extending from a top surface of said epitaxial layer to said buried impurity-doped region and in contact with a portion of said first electrode formed in said first window and said buried impurity-doped region, respectively, said first impurity-doped region having a third impurity concentration and forming a pn junction with said buried impurity-doped region; and a second electrode formed in said second window on said epitaxial layer, above said buried impurity-doped region and remote from said first electrode, said second electrode being formed of a conductive material and forming an ohmic contact with said epitaxial layer, said second electrode acting as an extended electrode of said Schottky barrier diode and said pn junction and being connected to the outer signal terminal, said Schottky barrier diode and said pn junction being electrically connected in parallel between said first and second electrodes, whereby electrostatic breakdown of said Schottky barrier diode due to an extraordinarily high voltage applied from the outer signal terminal is prevented by preferential breakdown of said pn junction.

2. A semiconductor device having an outer signal terminal connected thereto, comprising:
   a semiconductor substrate;
   an epitaxial layer of a first conductivity type, formed on said substrate and having a first concentration of impurities;
   a buried impurity-doped region of the first conductivity type, formed between said substrate and said epitaxial layer, said buried impurity-doped region having a second impurity concentration which is higher than the first impurity concentration of said epitaxial layer;
   an insulating layer formed on said epitaxial layer and having first and second windows formed therein;
   a first electrode formed in said first window and formed on said epitaxial layer above said buried impurity-doped region and formed of a conductive material, said first electrode formed in said first window being connected to the outer signal terminal and forming a Schottky barrier diode with said epitaxial layer;
   an impurity-doped region of a second conductivity type opposite the first conductivity type, extending from the top surface of said epitaxial layer to said buried impurity-doped region and in contact with a portion of said first electrode formed in said first window and said buried impurity-doped region, respectively, said impurity-doped region forming a pn junction with said buried impurity-doped region; and
   a second electrode formed in said second window and formed on said epitaxial layer, above said buried impurity-doped region and remote from said first electrode, said second electrode being formed of a conductive material and forming an ohmic contact with said epitaxial layer, said second electrode acting as an extended electrode of said Schottky barrier diode and said pn junction whereby electrostatic breakdown of said Schottky barrier diode, due to an extraordinarily high voltage application from the outer signal terminal is prevented by preferential breakdown of said pn junction.

3. A semiconductor device having an inner circuit element, and an outer terminal connected to said inner circuit element, comprising:
   a semiconductor substrate having a second conductivity type, the inner circuit element and the outer terminal formed on said semiconductor substrate;
   an epitaxial layer having a first conductivity type opposite the second conductivity type formed on said semiconductor substrate and having a first impurity concentration;
   an element isolating impurity-doped region having first and second portions having the second conductivity type formed in said epitaxial layer and extending from a top surface of said epitaxial layer into the substrate and defining a region of said epitaxial layer enclosed by said element isolating impurity-doped region as an element forming region;
   a first electrode of a conductive material formed on said epitaxial layer in said element forming region and being electrically connected to said inner circuit element, said first electrode forming a Schottky barrier diode with said epitaxial layer;
   a second electrode of a conductive material formed on said epitaxial layer in said element forming layer remote from said first electrode connected to the outer terminal and forming an ohmic contact with said epitaxial layer;
   a buried impurity-doped region of the first conductivity type formed between said semiconductor substrate and said epitaxial layer, extending below said first and second electrodes, said buried impurity-doped region including a first portion contacting the first portion of said element isolating impurity-doped region and a second portion formed from a distance from the second portion of said element-isolating impurity doped region, said buried impurity-doped region having a second impurity concentration which is higher than the first impurity concentration of said epitaxial layer, and said first portion of said buried impurity-doped region forming a pn junction with said element-isolating impurity-doped region, whereby electrostatic breakdown of said Schottky barrier diode due to an extraordinarily high voltage applied from the outer terminal is prevented by preferential breakdown of said pn junction.

4. A semiconductor device according to claim 1, further comprising a second impurity-doped region of the first conductivity type extending from the top surface of said epitaxial layer to said buried impurity-doped region and in contact with said second electrode and said buried impurity-doped region, respectively, said second impurity-doped region having a third impurity concentration which is higher than said first impurity concentration of said epitaxial layer.

5. A semiconductor device according to claim 1, further comprising an element-isolating impurity-doped region of the second conductivity type extending from a top surface of said epitaxial layer into said substrate and enclosing a portion of said epitaxial layer below said first and second electrodes, said element-isolating impurity-doped region having a third impurity concentration.

6. A semiconductor device according to claim 3, further comprising an impurity-doped region of the first conductivity type extending from a top surface of said epitaxial layer to said buried impurity-doped region and being in contact with said second electrode and said buried impurity-doped region, respectively.

7. A semiconductor device according to claim 3, further comprising a power source connected to said element-isolating impurity-doped region.

8. A semiconductor device according to claim 3, further comprising a ground connected to said element-isolating impurity-doped region.

* * * * *